United States Patent [19]
Doan et al.

[11] Patent Number: 6,084,289
[45] Date of Patent: *Jul. 4, 2000

[54] SEMICONDUCTOR PROCESSING METHOD OF FORMING A CONTACT OPENING TO A REGION ADJACENT A FIELD ISOLATION MASS, AND A SEMICONDUCTOR STRUCTURE

[75] Inventors: Trung Tri Doan, Boise; Charles H. Dennison, Meridian, both of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/095,773

[22] Filed: Jun. 10, 1998

Related U.S. Application Data

[62] Division of application No. 08/825,644, Apr. 3, 1997, Pat. No. 5,866,465.

[51] Int. Cl.[7] ........................... H01L 23/58; H01L 29/76; H01L 29/94
[52] U.S. Cl. ..................... 257/632; 257/647; 257/396; 257/397
[58] Field of Search .................................. 257/647, 396, 257/397, 752; 438/225, 297, 362, 425, 439, 452

[56] References Cited

U.S. PATENT DOCUMENTS

| | | | |
|---|---|---|---|
| 4,221,045 | 9/1980 | Godejahn, Jr. | 29/571 |
| 4,442,591 | 4/1984 | Haken | 29/571 |
| 4,587,711 | 5/1986 | Godejahn | 257/647 |
| 4,590,663 | 5/1986 | Haken | 257/647 |
| 4,746,219 | 5/1988 | Holloway et al. | 357/23.11 |
| 4,980,306 | 12/1990 | Shimbo | 437/34 |
| 5,219,793 | 6/1993 | Cooper et al. | 437/195 |
| 5,292,677 | 3/1994 | Dennison | 437/52 |
| 5,292,683 | 3/1994 | Dennison et al. | 437/63 |
| 5,362,669 | 11/1994 | Boyd et al. | 437/67 |
| 5,384,280 | 1/1995 | Aoki et al. | 437/67 |
| 5,397,908 | 3/1995 | Dennison et al. | 257/306 |
| 5,506,168 | 4/1996 | Morita et al. | 437/67 |
| 5,539,229 | 7/1996 | Noble, Jr. et al. | 257/301 |
| 5,814,848 | 9/1998 | Oshima | 257/210 |
| 5,866,465 | 2/1999 | Doan et al. | 438/424 |

FOREIGN PATENT DOCUMENTS

| | | |
|---|---|---|
| 0 549 055 | 6/1993 | European Pat. Off. . |
| 09 134954 | 5/1997 | Japan . |
| WO 91 10261 | of 0000 | WIPO . |

*Primary Examiner*—David Hardy
*Assistant Examiner*—Jhihan B. Clark
*Attorney, Agent, or Firm*—Wells, St. John, Roberts, Gregory & Matkin P.S.

[57] ABSTRACT

A semiconductor processing method of forming a contact opening to a region adjacent a field isolation mass includes, a) forming a field isolation mass within a semiconductor substrate by a trench and refill technique, and a substrate masking layer over the substrate adjacent the field isolation mass, the field isolation mass being capped with an etch stop cap, the field isolation mass having a sidewall covered by the masking layer; b) removing the substrate masking layer away from the isolation mass to expose at least a portion of the isolation mass sidewall; c) forming an etch stop cover over the exposed isolation mass sidewall; d) forming an insulating layer over the isolation mass and substrate area adjacent the isolation mass; and e) etching a contact opening through the insulating layer to adjacent the isolation mass selectively relative to the isolation mass etch stop cap and cover. A semiconductor structure is also described.

35 Claims, 8 Drawing Sheets

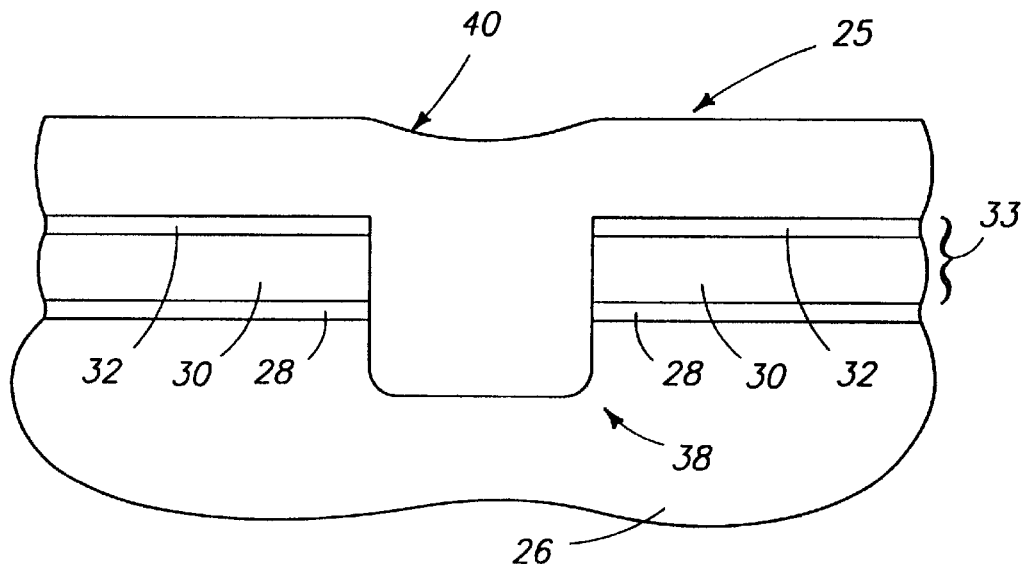
_FIG. 7_
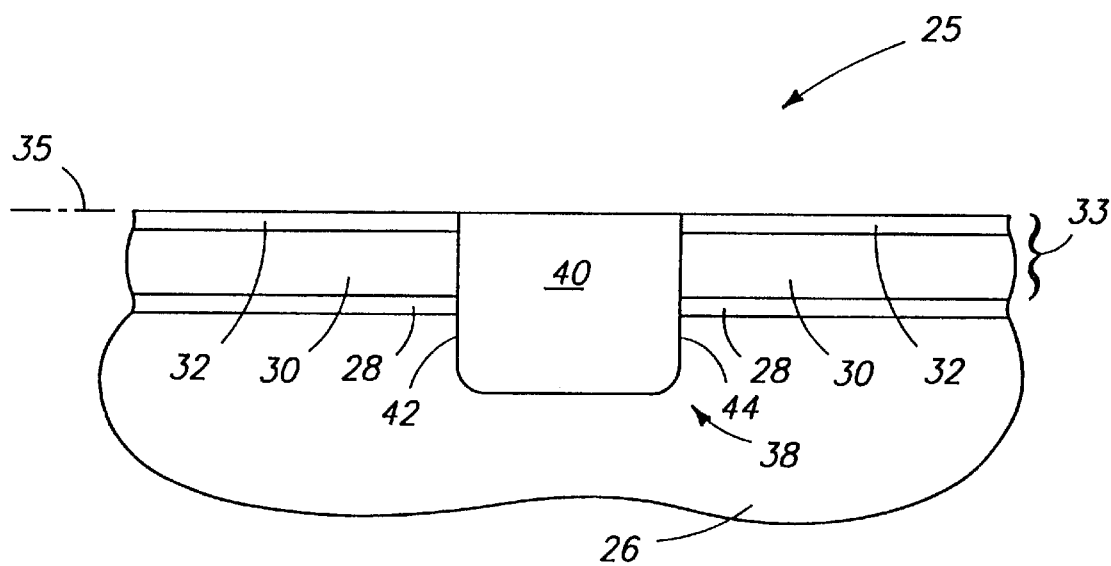
_FIG. 8_

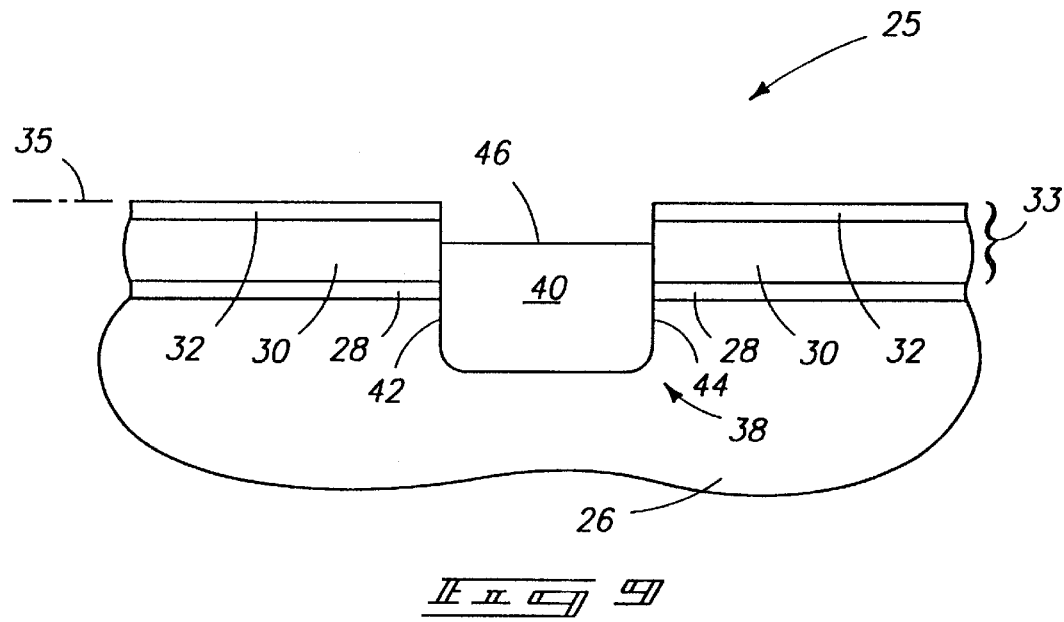
_Fig 9_
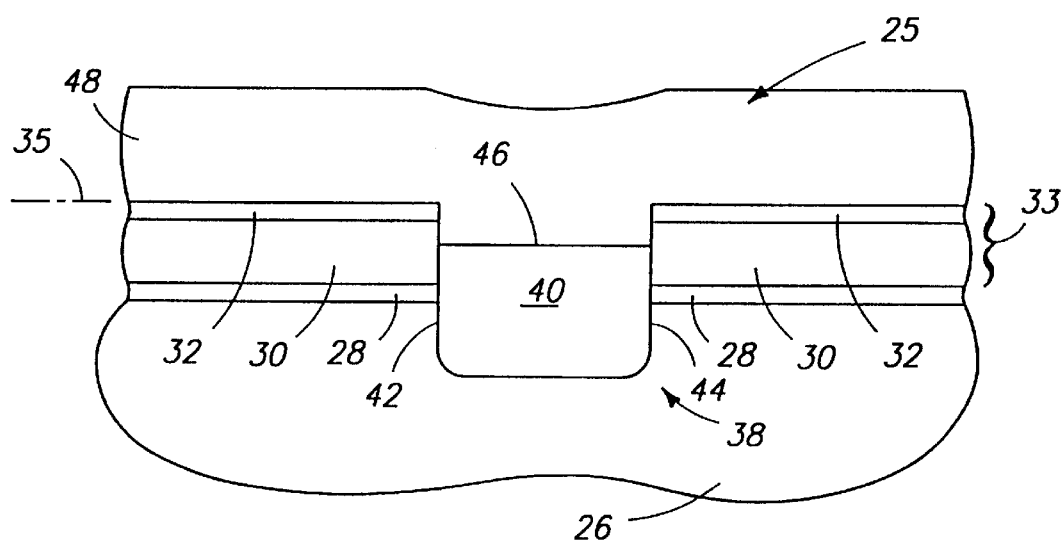
_Fig 10_

US 6,084,289

SEMICONDUCTOR PROCESSING METHOD OF FORMING A CONTACT OPENING TO A REGION ADJACENT A FIELD ISOLATION MASS, AND A SEMICONDUCTOR STRUCTURE

RELATED PATENT DATA

This patent is a divisional application of U.S. patent application Ser. No. 08/825,644, filed Apr. 3, 1997, entitled "A Semiconductor Processing Method of Forming a Contact Opening to a Region Adjacent a Field Isolation Mass, and a Semiconductor Structure", naming Trung Tri Doan and Charles H. Dennison as inventors, and which is now U.S. Pat. No. 5,866,465 the disclosure of which is incorporated by reference.

TECHNICAL FIELD

This invention relates to a semiconductor structure and semiconductor processing method of forming a contact opening to a region adjacent a field isolation mass.

BACKGROUND OF THE INVENTION

Implementing an integrated circuit involves interconnecting electronic devices which are formed on a substrate with other devices on the substrate or the outside world. Typically, such an interconnection is formed by depositing an insulating layer over the substrate and then conducting a contact etch through the insulating layer to a part of a device component thereunder. An example of a part of a device component is a diffusion region which forms a source/drain region in a MOS device.

Typically, when such a contact etch is to be performed, insulating material such as nitride sidewall spacers serve to protect certain device components, such as word lines, from a misalignment of the contact etch. This is commonly referred to as a self-aligned contact etch. Problems arise, however, when such a contact etch is to be conducted over a field isolation mass, such as a field oxide. Such problems are discussed directly below in connection with FIGS. 1–3.

FIG. 1 illustrates a semiconductor wafer fragment 10 comprised of a bulk silicon substrate region 12 and a field oxide region 13. A gate oxide layer 14 overlies silicon substrate 12. A conductive line 15 overlies gate oxide 14, and a conductive line 16 overlies field oxide region 13. Both lines 15 and 16 are provided with an etch resistant cap 17 and sidewall spacers 18 of nitride or some other etch resistant material. Diffusion regions 19 and 20 are provided on either side of line 15 and define source/drain regions to which electrical connection will be made.

Referring to FIG. 2, a planarized oxide insulating material 21 is provided over substrate region 12 and patterned with photomask 22 to define a contact opening 23 to diffusion region 20. As shown, photomask 22 is misaligned somewhat to the left, the effect of which is to provide the contact opening etch directly over field oxide region 13.

Referring to FIG. 3, contact opening 23 has been etched through the oxide insulating material 21, and due to the photomask misalignment, a portion 24 of field oxide region 13 is also undesirably etched away. Etching away a portion of the field oxide region as shown is undesirable because such may cause shorts to the substrate and leakages which render a device inoperative.

One proposed solution is to provide a thin etch stop layer over the word line and the field oxide region. However, this solution fails when the space through which a contact opening is to be made is very narrow. This is because the thin etch stop layer tends to clog such space and is oftentimes non-uniformly distributed therethrough.

This invention arose out of concerns associated with forming a contact opening to a region adjacent a field isolation mass without the risk of etching the field isolation mass during provision of the contact opening.

BRIEF DESCRIPTION OF THE DRAWINGS

Preferred embodiments of the invention are described below with reference to the following accompanying drawings.

FIG. 7 is a view of the FIG. 4 wafer fragment at a processing step subsequent to that shown by FIG. 6.

FIG. 8 is a view of the FIG. 4 wafer fragment at a processing step subsequent to that shown by FIG. 7.

FIG. 9 is a view of the FIG. 4 wafer fragment at a processing step subsequent to that shown by FIG. 8.

FIG. 10 is a view of the FIG. 4 wafer fragment at a processing step subsequent to that shown by FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a contact opening to a region adjacent a field isolation mass comprises the following steps:

forming a field isolation mass within a semiconductor substrate by a trench and refill technique, and a masking layer over the substrate adjacent the field isolation mass, the field isolation mass being capped with an etch stop cap, the field isolation mass having a sidewall covered by the masking layer;

removing the substrate masking layer away from the isolation mass to expose at least a portion of the isolation mass sidewall;

forming an etch stop cover over the exposed isolation mass sidewall;

forming an insulating layer over the isolation mass and substrate area adjacent the isolation mass; and etching a contact opening through the insulating layer to adjacent the isolation mass selectively relative to the isolation mass etch stop cap and cover.

In accordance with another aspect of the invention, a semiconductor processing method of forming a contact opening to a region adjacent a field isolation mass comprises the following steps:

forming a field isolation mass within a semiconductor substrate by a trench and refill technique, and an electrically conductive masking layer over the substrate adjacent the field isolation mass, the field isolation mass having a sidewall covered by the masking layer, the field isolation mass and masking layer defining a generally planar outer surface;

removing an amount of the field isolation mass sufficient to define a field isolation mass surface spaced inwardly from the masking layer planar outer surface;

forming an etch stop cap atop the field isolation mass surface;

patterning the substrate masking layer away from the isolation mass to form at least a portion of a device component spaced from the isolation mass and to expose the isolation mass sidewall;

forming an etch stop cover over the exposed isolation mass sidewall;

forming an insulating layer over the isolation mass and device component; and etching a contact opening through the insulating layer to between the isolation mass sidewall and device component selectively relative to the isolation mass etch stop cap and etch stop cover.

In accordance with another aspect of the invention, a semiconductor structure comprises:

a semiconductor substrate having a substrate surface;

a field isolation mass projecting outwardly from the substrate surface including a substantially vertical sidewall at least a portion of which extends above the substrate surface, the isolation mass including a top having a cap of a first etch stop material; and a cover of a second etch stop material covering the field isolation mass sidewall.

Figure 1:
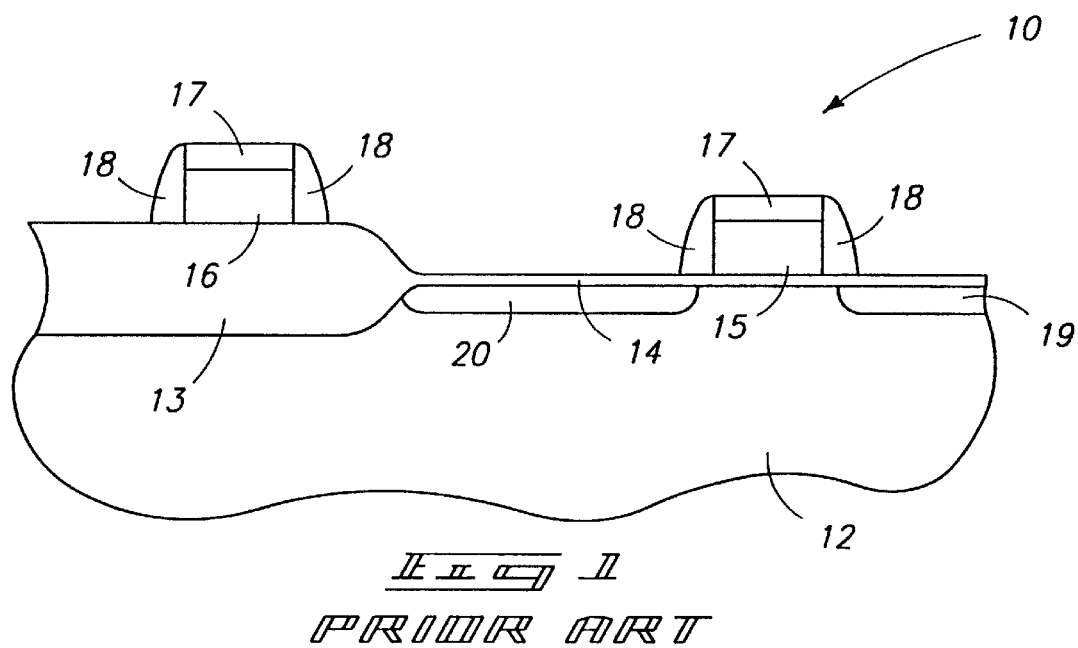
FIG. 1 is a diagrammatic sectional view of a prior art semiconductor wafer fragment at one prior art processing step, and is discussed in the "Background" section above.
Figure 2:
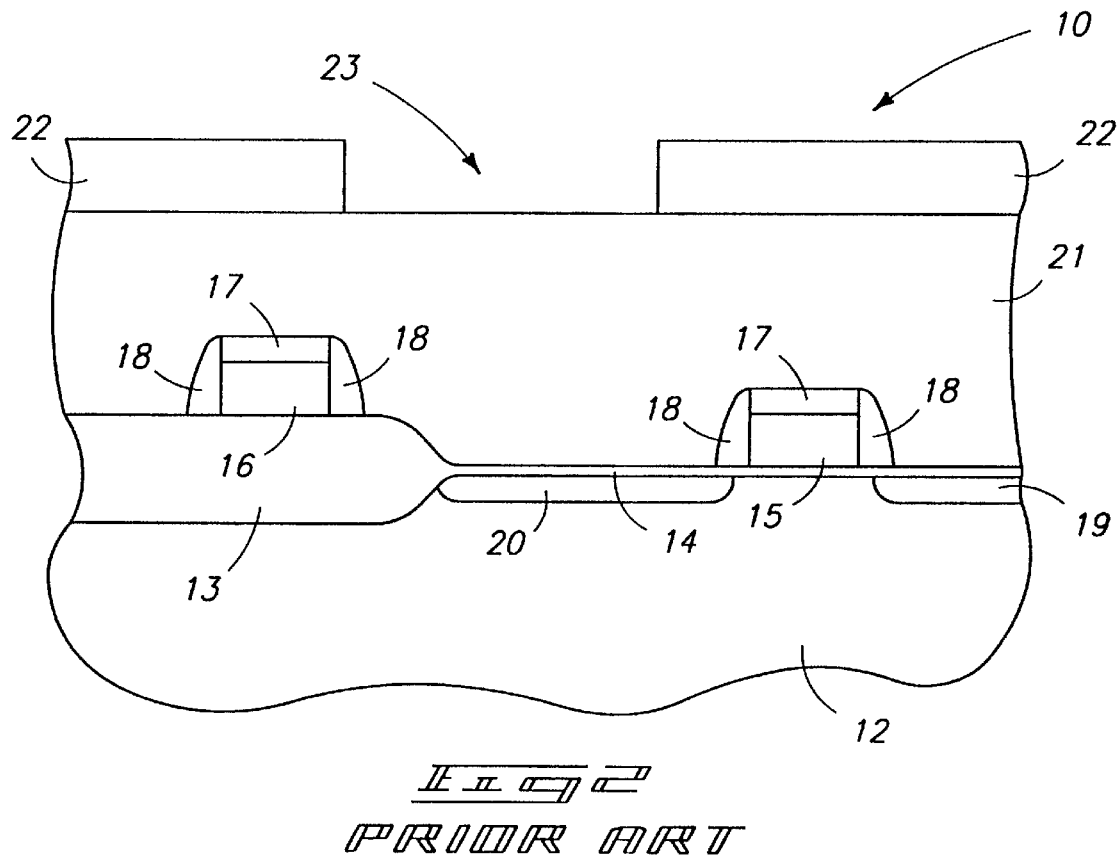
FIG. 2 is a view of the FIG. 1 prior art wafer fragment at a prior art processing step subsequent to that shown by FIG. 1.
Figure 3:
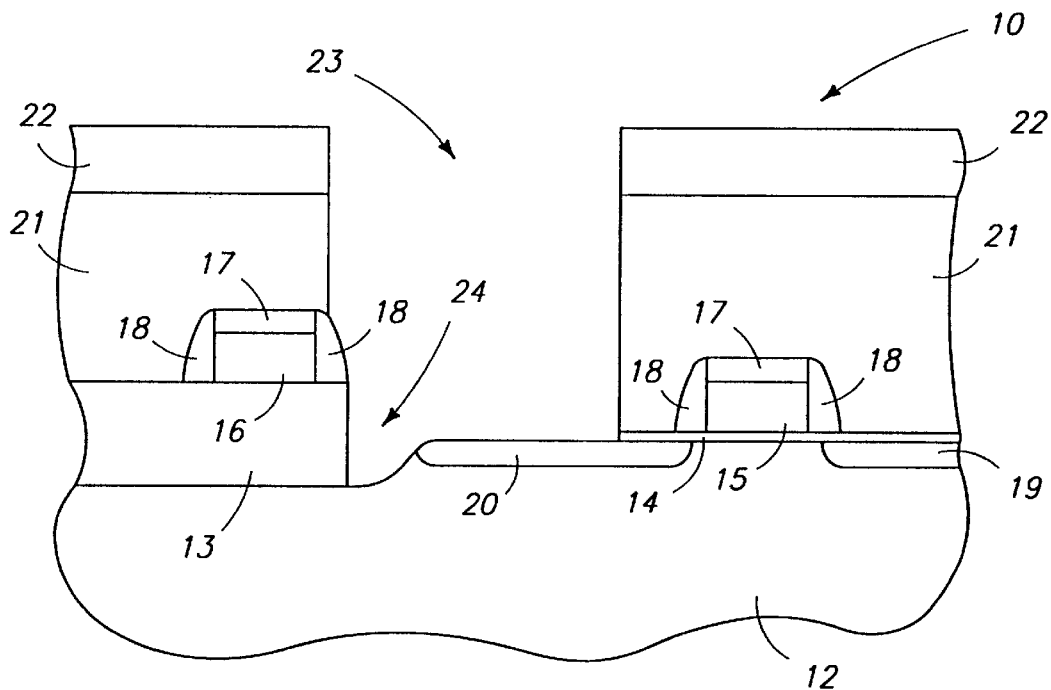
FIG. 3 is a view of the FIG. 1 prior art wafer fragment at a prior art processing step subsequent to that shown by FIG. 2.
Figure 4:
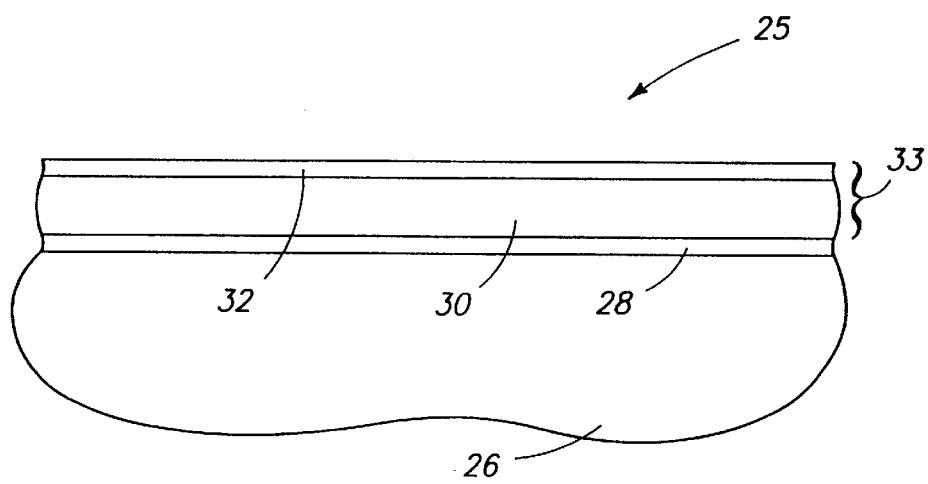
FIG. 4 is a diagrammatic sectional view of a semiconductor wafer fragment at one processing step in accordance with the invention.

Referring to FIGS. 4–16, and first to FIG. 4, a semiconductor wafer fragment is indicated generally with reference numeral 25. Such comprises a bulk semiconductor substrate 26 (preferably monocrystalline silicon) having a gate oxide layer 28 and a conductive polysilicon layer 30 thereover. An overlying layer 32 may optionally be provided or formed atop polysilicon layer 30. If so provided or formed, layer 32 may or may not be electrically conductive. Layer 32 serves as an etch stop layer which provides greater selectivity than polysilicon layer 30 for a subsequent planarizing step described below. Preferably, layer 32 is conductive and comprises a tungsten silicide (WSi$_x$), although other materials such as various nitrides, or other ceramic materials or refractory-containing materials may be used. For example, materials such as TiSi$_x$, W, WN$_x$, Ta, TaN, and TiN may be used. For purposes of the continuing discussion, layers 30, 32 comprise an electrically conductive composite masking layer 33 wherein layer 32 defines an etch stop top layer.

Figure 5:
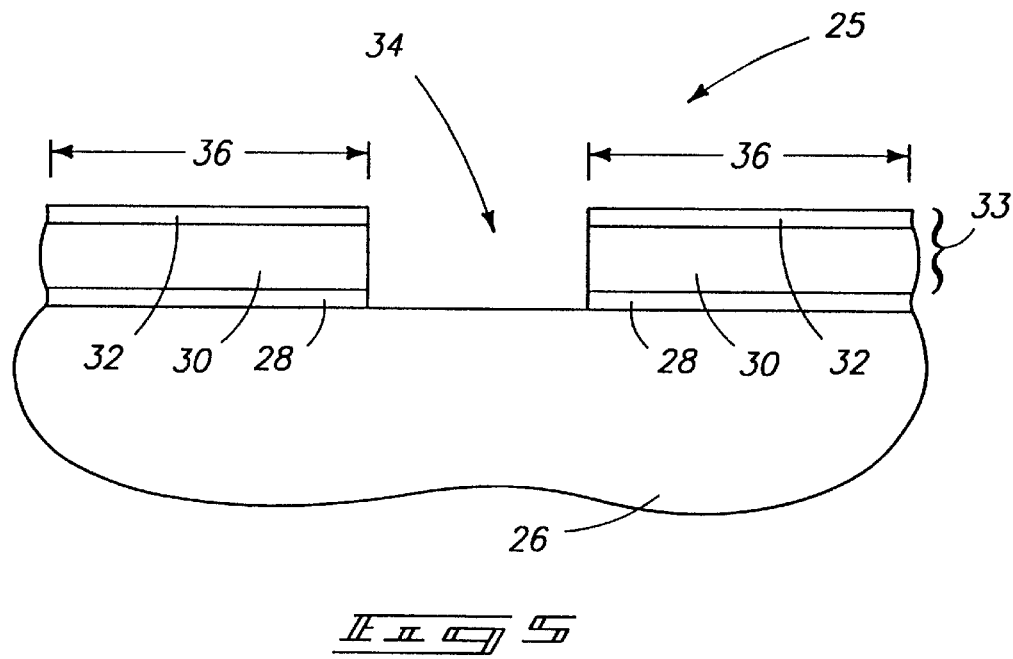
FIG. 5 is a view of the FIG. 4 wafer fragment at a processing step subsequent to that shown by FIG. 4.

Referring to FIG. 5, an active area definition step is undergone in which masking layer 33 is patterned and the masking layer and gate oxide 28 are etched to expose a portion 34 of substrate 26 within which a field isolation mass will be formed, essentially preferably by a trench and refill technique to be described below. The patterning and etching defines active areas 36 on either side of the exposed substrate portion 34.

Figure 6:
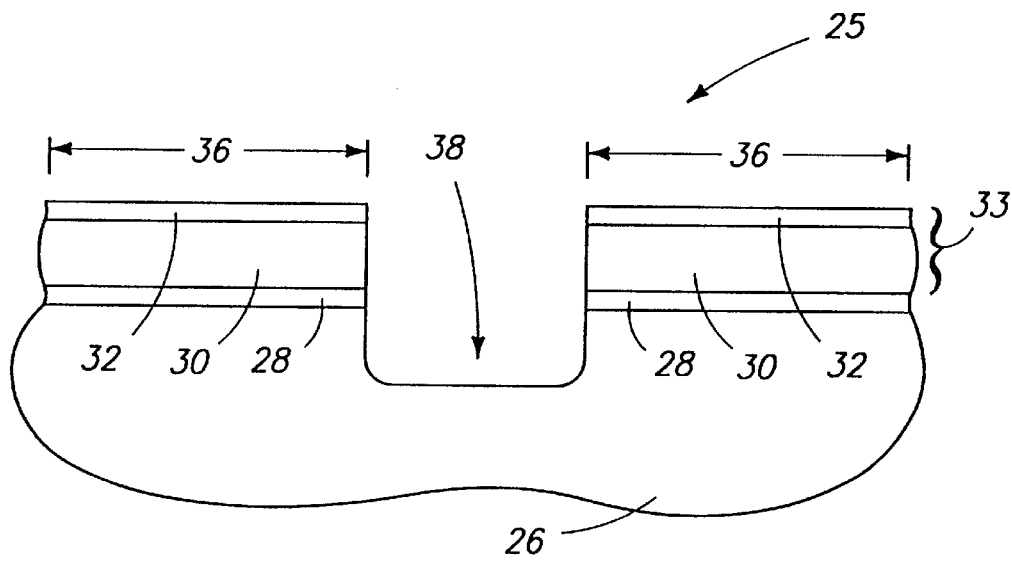
FIG. 6 is a view of the FIG. 4 wafer fragment at a processing step subsequent to that shown by FIG. 5.

Referring to FIG. 6, a recess 38 is formed into substrate 26 by either a wet or dry etch, and preferably a dry etch, to a depth of around 2500 Angstroms. A field implant step can be conducted to improve subsequent isolation within bulk substrate 26. Additionally, at this point a slight thermal oxidation can be conducted to create a thin oxide layer at the base of recess 38 having a thickness of about 50–200 Angstroms. Such thermal oxide layer provides better adherence of a subsequently deposited oxide layer.

Referring to FIG. 7, a layer 40 of insulating material, preferably SiO$_2$, is deposited by chemical vapor deposition and completely fills recess 38.

Referring to FIG. 8, layer 40 is planarized, preferably by a chemical-mechanical polish (CMP), at least down to overlying etch stop top layer 32. Utilizing WSi$_x$ for etch stop top layer 32 is desirable because such provides a polish/etch selectivity of around 50:1. Other materials, however, could be utilized. For example, nitride has a good selectivity of around 10:1. Additionally, polysilicon layer 30 could, by itself, also be used as an etch stop layer, although the selectivity may be much lower than those materials discussed above.

The above-described formation of field oxide layer 40 sets forth a preferred, so-called trench and refill technique by which a field isolation mass is provided or formed with in a semiconductor substrate. In the ongoing discussion, the field isolation mass is referred to with reference numeral 40, and includes two substantially vertical sidewalls 42, 44.

As discussed above and referring still to FIG. 8, conductive layer 30 and optional overlying layer 32 define a composite masking layer 33 which, after formation of field isolation mass 40, covers sidewalls 42, 44 of the field isolation mass. For purposes of ongoing discussion, field isolation mass 40 and masking layer 33 define a generally planar outer first surface 35.

Referring to FIGS. 9 and 10, an etch stop cap is formed on top of field isolation mass 40. Such is formed by first conducting a wet or dry etch (and preferably a dry etch) of field isolation mass 40 to remove an amount sufficient to define a field isolation mass surface or second surface 46. Surface 46 is spaced inwardly from that portion of planar outer first surface 35 defined by masking layer 33. As shown, second surface 46 is spaced below first surface 35, and preferably below layer 32.

Referring to FIG. 10, a layer of etch stop material 48 is deposited atop the field isolation mass surface and the masking layer planar outer surface. The formed layer of etch stop material 48 preferably covers the first and second surfaces 35, 46 respectively, and completely fills in the recess over field isolation mass 40. A preferred etch stop material is Si$_3$N$_4$, although other materials such as Al$_2$O$_3$, Ta$_2$O$_5$, TiO$_2$, and other insulating materials may be used.

Figure 11:
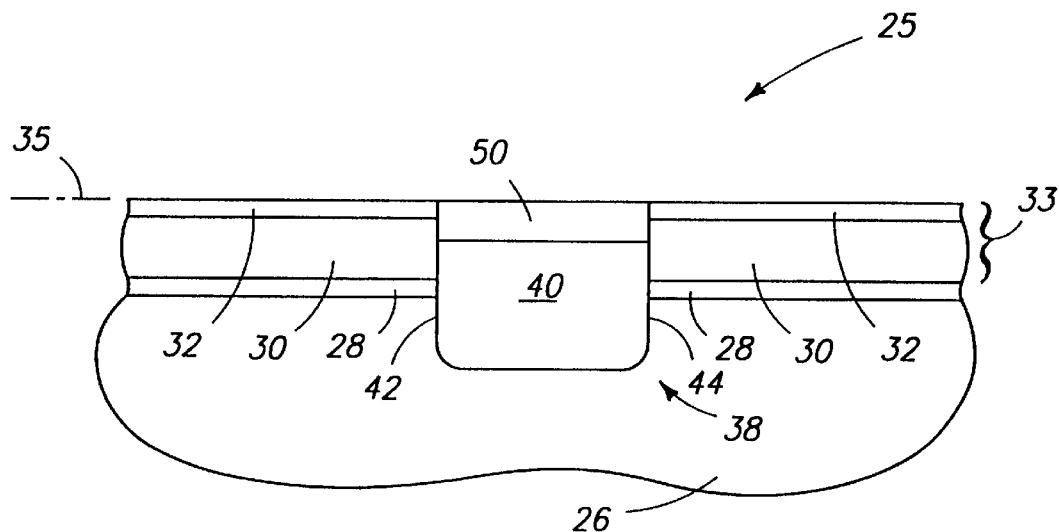
FIG. 11 is a view of the FIG. 4 wafer fragment at a processing step subsequent to that shown by FIG. 10.

Referring to FIG. 11, etch stop material 48 is planarized as by chemical-mechanical polishing, to at least first surface 35 thereby defining an etch stop cap 50 atop the field isolation mass 40. Other techniques could, of course, also be used.

Figure 12:
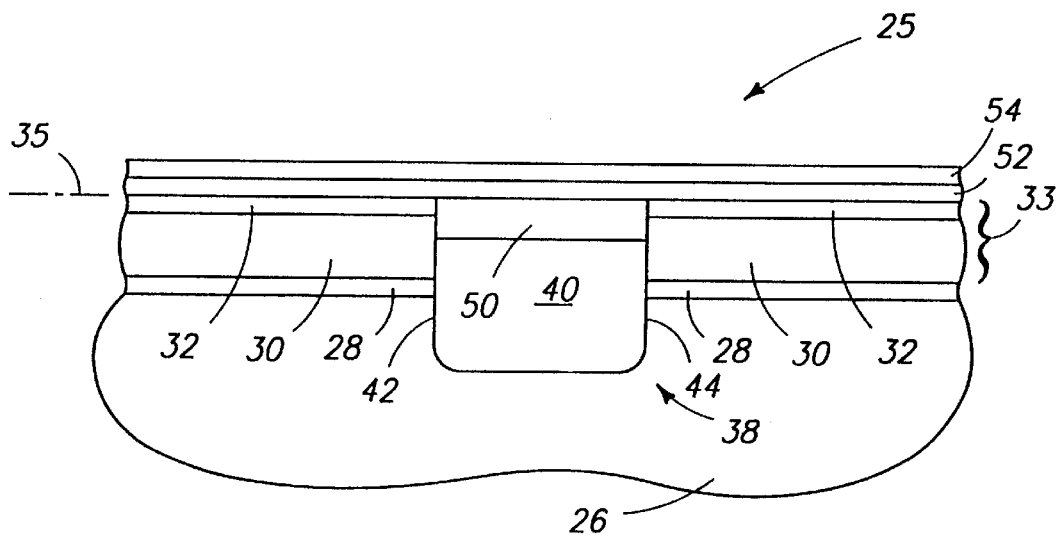
FIG. 12 is a view of the FIG. 4 wafer fragment at a processing step subsequent to that shown by FIG. 11.

Referring to FIG. 12, a conductive layer 52 such as polysilicon, Ti, TiN/W, WSi$_x$, TiSi$_x$, (and preferably TiSi$_x$) is provided or formed over the first surface 35 and interconnects subsequently formed polysilicon blocks defining continuously running word lines. If a nonconductive material was previously used for etch stop top layer 32, such is removed prior to provision of layer 52. Additionally, an etch stop layer 54 is provided or formed atop conductive layer 52 to insulate the conductive layer during subsequent gate definition and etching procedures. Preferably etch stop layer 54 is formed from the same material which forms etch stop cap 50, such material preferably being nitride.

Figure 13:
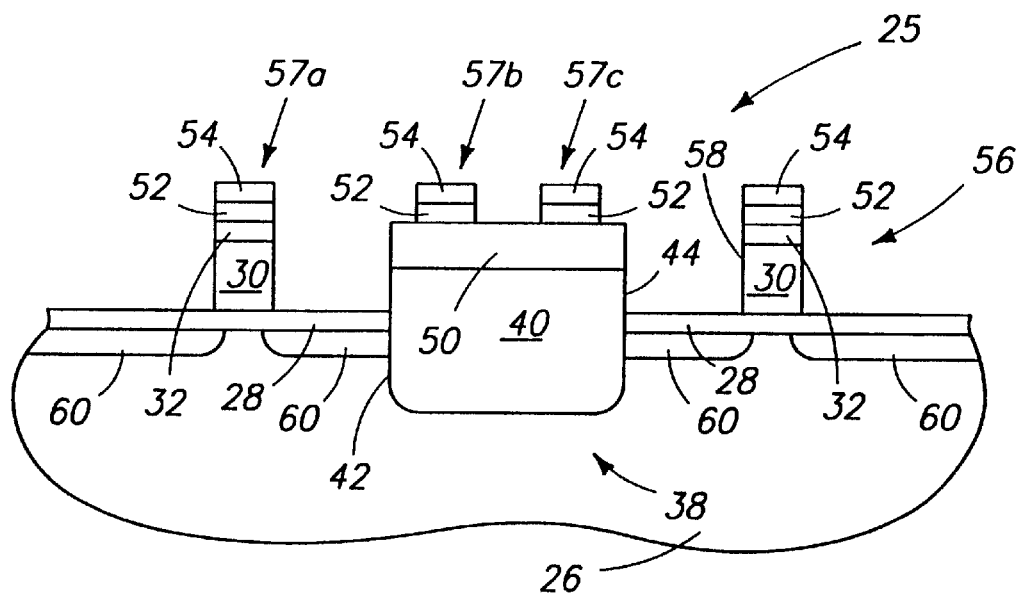
FIG. 13 is a view of the FIG. 4 wafer fragment at a processing step subsequent to that shown by FIG. 12.

Referring to FIG. 13, conductive layer 52 and substrate masking layer 33 are patterned and etched away from isolation mass 40 to form at least a portion of a device component 56. In the illustrated and preferred embodiment, component 56 is in the form of a conductive transistor line running into and out of the plane of the page upon which FIG. 13 lies. Preferably, the patterning and etching step defines a plurality of device components, such as lines 56, 57a, 57b, and 57c. For purposes of the ongoing discussion, the rightmost device component 56 will be described, it being understood that the achieved advantages apply to other such similar device components. Component 56 is spaced laterally from isolation mass 40. The patterned etch which produces component 56 exposes at least a substantially vertical portion of isolation mass sidewall 44, and defines a device component sidewall 58 which faces isolation mass sidewall 44. At this point, conductivity enhancing impurity may be provided to a first concentration into the substrate between isolation mass sidewall 44 and device component portion 56 to define lightly doped drain structures 60.

Figure 14:
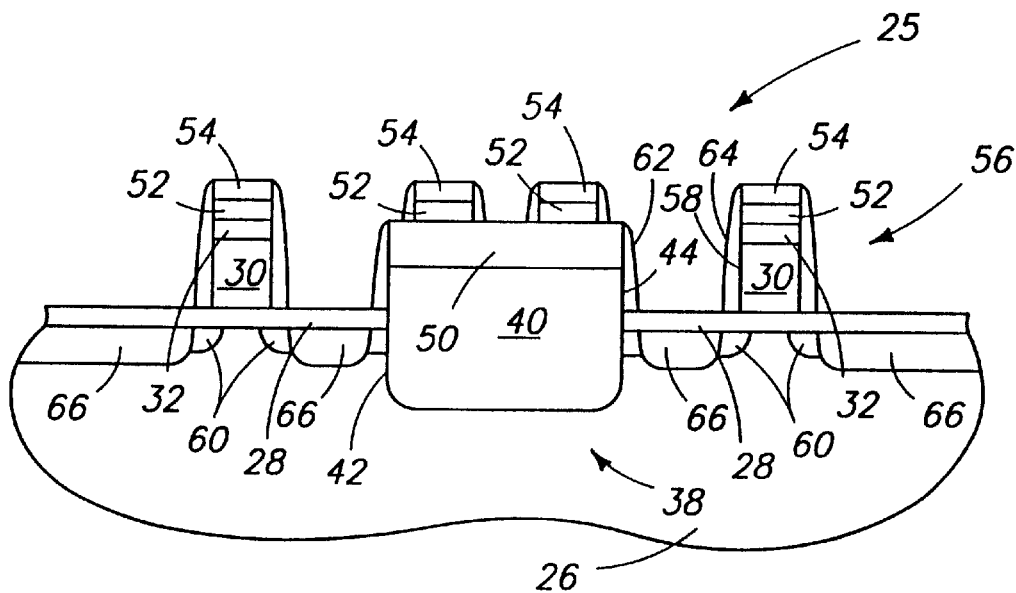
FIG. 14 is a view of the FIG. 4 wafer fragment at a processing step subsequent to that shown by FIG. 13.

Referring to FIG. 14, a second etch stop material is deposited over the substrate and preferably over the exposed isolation mass sidewall 44 and device component sidewall 58. The deposited etch stop material is referred to as a "second" etch stop material in the sense that a first etch stop material, i.e. the material defining etch stop cap 50, has already been deposited. A subsequent anisotropic etch of the second etch stop material is conducted to a degree sufficient to leave a sidewall spacer 62 over the exposed isolation mass sidewall 44, and a sidewall spacer 64 over device component sidewall 58. Sidewall spacer 62, however, need not necessarily be provided or formed over sidewall 44. Sidewall spacers are also formed on other device components as shown. Sidewall spacers 62, 64 form an etch stop cover over the respective sidewalls to which such are adjoined. Preferably, etch stop cap 50 and sidewall spacers 62, 64 are comprised of the same material, such as Si$_3$N$_4$, although other materials may be used. At this point, a conductivity enhancing impurity is provided into the substrate to a second concentration between isolation mass 40 and device component portion 56. The second concentration is preferably greater than the first concentration and together therewith defines respective source/drain regions 66.

As shown, a semiconductor structure is provided having a field isolation mass 40 which projects outwardly from the substrate surface. The field isolation mass includes substantially vertical sidewall 44, at least of portion of which extends above the substrate surface. Field isolation mass 40 includes a top having an etch stop cap 50 and at least one cover or sidewall spacer, a representative one of which is indicated with numeral 62 covering sidewall 44.

Figure 15:
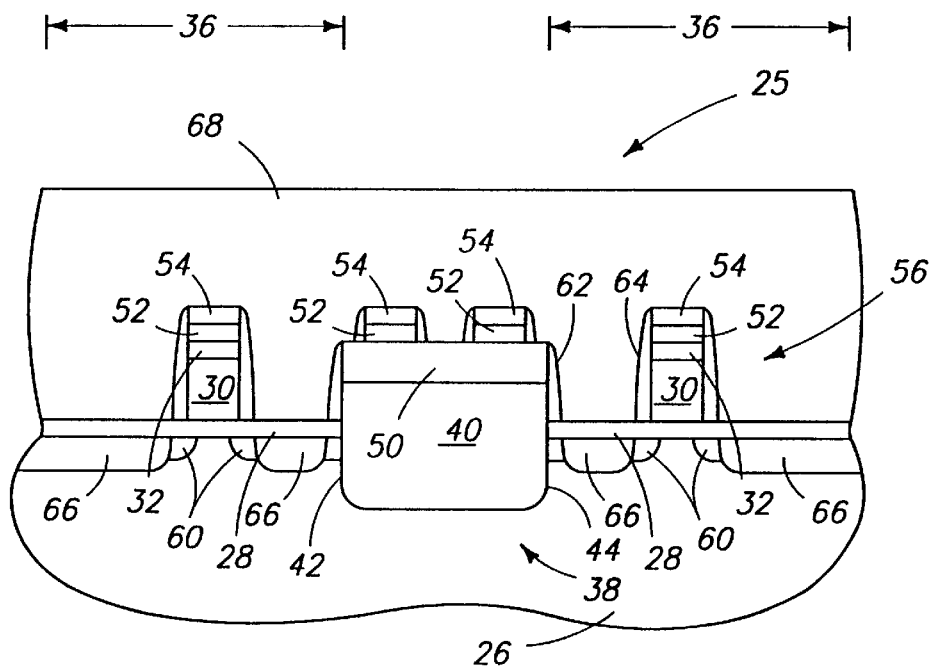
FIG. 15 is a view of the FIG. 4 wafer fragment at a processing step subsequent to that shown by FIG. 14.

Referring to FIG. 15, an insulating layer 68 is formed over isolation mass 40 and active area 36 adjacent thereto, effectively over device component 56.

Figure 16:
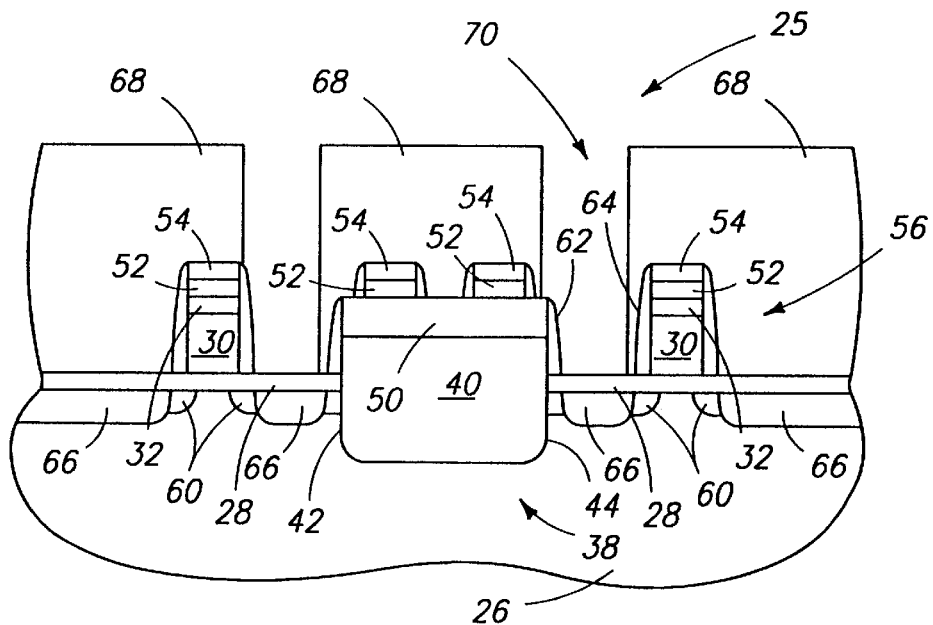
FIG. 16 is a view of the FIG. 4 wafer fragment at a processing step subsequent to that shown by FIG. 15.

Referring to FIG. 16, a contact opening 70 is patterned and etched through the insulating layer 68 to between the isolation mass sidewall 44 and device component 56. Contact opening 70 is shown as being misaligned due to a misalignment of the photomask defining the contact opening. More specifically, referring to isolation mass 40, insulating material 68 may be seen to overlie a major portion of etch stop cap 50, leaving exposed a small portion of the etch stop cap and sidewall spacer 62 on the right-hand side of the isolation mass as viewed in FIG. 16. Notwithstanding such misalignment, field isolation mass 40 is protected during a subsequent contact etch due to etch stop cap 50 and sidewall spacer 62 which effectively seals the field isolation mass.

The above described preferred semiconductor processing method and structure allow for contact openings to be formed in a region adjacent a field isolation mass without the risk that an over etch of the contact opening will etch away field isolation mass material. Additionally, advantages in scalability are achieved because smaller structures may be fabricated without the problems stemming from the use of thin film etch stop layers described above. Furthermore, because the preferred field isolation mass is deposited rather than grown, the problems associated with the characteristic bird's beak structure of grown field oxides is virtually eliminated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor structure comprising:
   a semiconductor substrate having an isolation trench formed therein and a substrate surface;
   a field isolation mass received within the isolation trench and projecting outwardly from the substrate surface, the field isolation mass including a substantially vertical sidewall portion extending from a location below the substrate surface continuously to a location above the substrate surface, the isolation mass including a top having a cap of a first etch stop material; wherein the cap has a laterally outermost sidewall which is in registered alignment with the substantially vertical sidewall portion of the field isolation mass; and
   a cover of a second etch stop material covering the field isolation mass sidewall.

2. The semiconductor structure of claim 1, wherein the cap defines a generally planar surface.

3. The semiconductor structure of claim 1, wherein the cap and the cover comprise the same etch stop material.

4. The semiconductor structure of claim 1, wherein the cap and the cover predominately comprise Si$_3$N$_4$.

5. The semiconductor structure of claim 1 further comprising a device component laterally spaced from the field isolation mass sidewall, the device component including a sidewall covered by an etch stop material.

6. The semiconductor structure of claim 1 wherein the first and second etch stop materials are electrically insulative.

7. The semiconductor structure of claim 1 wherein the cover has an uppermost surface, the cover tapering gradually from a thinnest portion proximate the uppermost surface to a thickest portion away therefrom.

8. The semiconductor structure of claim 1 wherein the cap and the cover consist essentially of the same material.

9. The semiconductor structure of claim 1 wherein the cap is coextensive with the field isolation mass top.

10. The semiconductor structure of claim 2 wherein the cap is coextensive with the field isolation mass top.

11. The semiconductor structure of claim 3 wherein the cap is coextensive with the field isolation mass top.

12. The semiconductor structure of claim 4 wherein the cap is coextensive with the field isolation mass top.

13. The semiconductor structure of claim 6 wherein the cap is coextensive with the field isolation mass top.

14. The semiconductor structure of claim 7 wherein the cap is coextensive with the field isolation mass top.

15. The semiconductor structure of claim 8 wherein the cap is coextensive with the field isolation mass top.

16. A semiconductor structure comprising:
   a semiconductor substrate having an isolation trench formed therein and a substrate surface;
   a field isolation mass received within the isolation trench and projecting outwardly from the substrate surface, the field isolation mass including a substantially vertical sidewall portion extending from a location below the substrate surface continuously to a location above the substrate surface, the isolation mass including a top having a cap of a first electrically insulative etch stop material the cap having at least one sidewall; and
   a cover of an electrically insulative second etch stop material covering the field isolation mass sidewall and the cap sidewall, the second etch stop material comprising a material which is different from the first etch stop material.

17. The semiconductor structure of claim 16, wherein the cap defines a generally planar surface.

18. The semiconductor structure of claim 16, wherein the cap comprises $Si_3N_4$.

19. The semiconductor structure of claim 16, wherein the cover comprises $Si_3N_4$.

20. The semiconductor structure of claim 16 further comprising a device component laterally spaced from the field isolation mass sidewall, the device component including a sidewall covered by an etch stop material.

21. The semiconductor structure of claim 16 wherein the cover has an uppermost surface, the cover tapering gradually from a thinnest portion proximate the uppermost surface to a thickest portion away therefrom.

22. The semiconductor structure of claim 16 wherein the cap is coextensive with the field isolation mass top.

23. The semiconductor structure of claim 17 wherein the cap is coextensive with the field isolation mass top.

24. The semiconductor structure of claim 18 wherein the cap is coextensive with the field isolation mass top.

25. The semiconductor structure of claim 19 wherein the cap is coextensive with the field isolation mass top.

26. The semiconductor structure of claim 21 wherein the cap is coextensive with the field isolation mass top.

27. A semiconductor structure comprising:
   a semiconductor substrate having an isolation trench formed therein and a substrate surface;
   a field isolation mass received within the isolation trench and projecting outwardly from the substrate surface, the field isolation mass including a substantially vertical sidewall portion extending from a location below the substrate surface continuously to a location above the substrate surface, the isolation mass including a top having a cap of a first electrically insulative etch stop material;
   a cover of an electrically insulative second etch stop material covering the field isolation mass sidewall, the second etch stop material comprising a material which is different from the first etch stop material; and
   wherein the cap has a laterally outermost sidewall which is in registered alignment with the substantially vertical sidewall portion of the field isolation mass.

28. The semiconductor structure of claim 27 wherein the cap is coextensive with the field isolation mass top.

29. A semiconductor structure comprising:
   a semiconductor substrate having an isolation trench formed therein and a substrate surface;
   a field isolation mass received within the isolation trench and projecting outwardly from the substrate surface, the field isolation mass including a substantially vertical sidewall portion extending from a location below the substrate surface continuously to a location above the substrate surface, the isolation mass including a top having a cap of a first etch stop material, the cap having a first maximum thickness over the isolation mass, the cap being coextensive with the field isolation mass top; and
   a cover of a second etch stop material covering the field isolation mass sidewall, the cover not being received below the semiconductor substrate surface and having a second maximum thickness from the sidewall of the field isolation mass, the first maximum thickness being greater than the second maximum thickness.

30. The semiconductor structure of claim 29 wherein the cap thickness over the isolation mass is substantially constant at the first maximum thickness.

31. The semiconductor structure of claim 29 wherein the cover thickness from the sidewall of the field isolation mass is not substantially constant at the second maximum thickness.

32. The semiconductor structure of claim 29 wherein,
   the cap thickness over the isolation mass is substantially constant at the first maximum thickness; and
   the cover thickness from the sidewall of the field isolation mass is not substantially constant at the second maximum thickness.

33. The semiconductor structure of claim 29 wherein the first and second etch stop materials are different.

34. The semiconductor structure of claim 29 wherein the first and second etch stop materials are electrically insulative.

35. A semiconductor structure comprising:
   a semiconductor substrate having an isolation trench formed therein and a substrate surface;
   a field isolation mass received within the isolation trench and projecting outwardly from the substrate surface, the field isolation mass including a substantially vertical sidewall portion extending from a location below the substrate surface continuously to a location above the substrate surface, the isolation mass including a top having a cap of a first etch stop material, the cap having a first maximum thickness over the isolation mass; and
   a cover of a second etch stop material covering the field isolation mass sidewall, the cover not being received below the semiconductor substrate surface and having a second maximum thickness from the sidewall of the field isolation mass, the first maximum thickness being greater than the second maximum thickness, wherein the first and second etch stop materials are the same.

* * * * *